United States Patent
Tzu

[11] Patent Number: 5,935,736
[45] Date of Patent: Aug. 10, 1999

[54] MASK AND METHOD TO ELIMINATE SIDE-LOBE EFFECTS IN ATTENUATED PHASE SHIFTING MASKS

[75] Inventor: San-De Tzu, Taipei, Taiwan

[73] Assignee: Taiwan Semiconductors Manufacturing Company Ltd., Hsin-Chu, Taiwan

[21] Appl. No.: 08/957,676

[22] Filed: Oct. 24, 1997

[51] Int. Cl.$^6$ .................................................... G03F 9/00
[52] U.S. Cl. .................................................................. 430/5
[58] Field of Search .............................. 430/5, 322, 324; 216/12

[56] References Cited

U.S. PATENT DOCUMENTS

| | | | |
|---|---|---|---|
| 5,288,569 | 2/1994 | Lin | 430/5 |
| 5,510,214 | 4/1996 | Pan et al. | 430/5 |
| 5,593,801 | 1/1997 | Yoshioka et al. | 430/5 |
| 5,620,817 | 4/1997 | Hsu et al. | 430/5 |

*Primary Examiner*—S. Rosasco
*Attorney, Agent, or Firm*—George O. Saile; Stephen B. Ackerman; Larry J. Prescott

[57] ABSTRACT

A mask, method of forming the mask, and method of using the mask to form images in a layer of resist layer on an integrated circuit wafer are described. The mask has a first pattern formed in a layer of attenuating phase shifting material. A second pattern formed in a layer of opaque material is formed on the layer of attenuating phase shifting material such that the pattern edges of the first pattern formed in attenuating phase shifting material are exposed, thereby forming a rim type attenuating phase shifting mask. Using this mask to expose a resist layer formed in an integrated circuit wafer achieves the advantages of attenuating phase shifting masks while avoiding problems due to side-lobe effect.

20 Claims, 7 Drawing Sheets

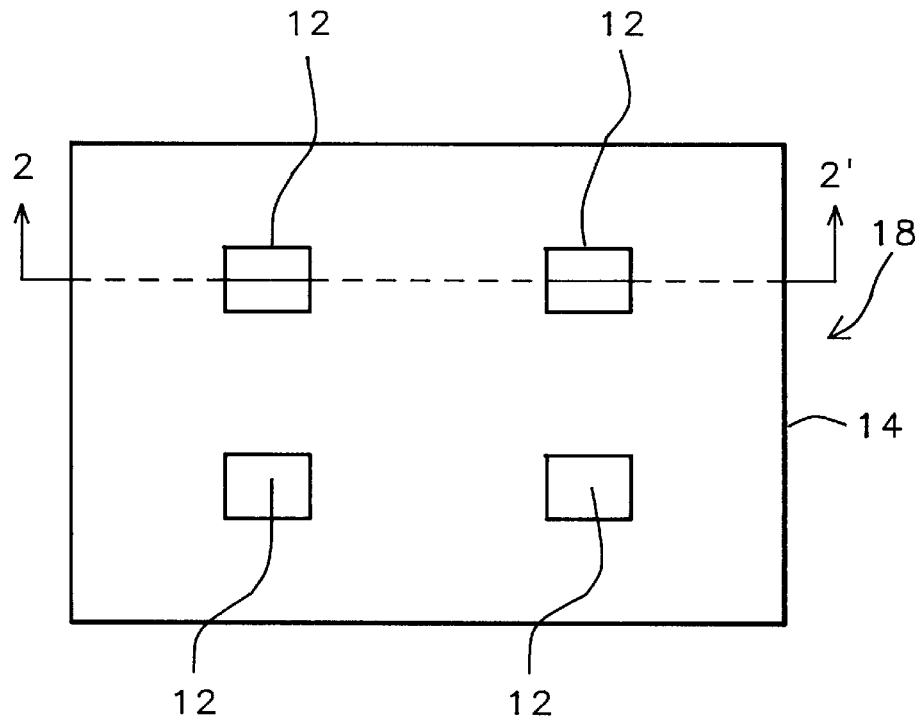
FIG. 1 - Prior Art
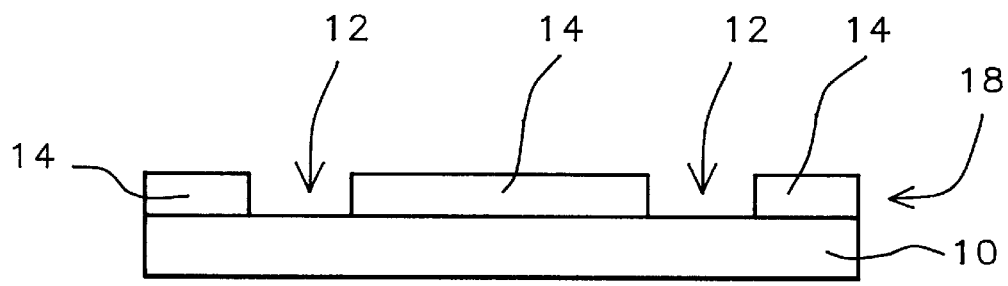
FIG. 2 - Prior Art

MASK AND METHOD TO ELIMINATE SIDE-LOBE EFFECTS IN ATTENUATED PHASE SHIFTING MASKS

BACKGROUND OF THE INVENTION (1) Field of the Invention

This invention relates to the use of attenuating phase shifting masks and more particularly to rim type attenuating phase shifting masks used to avoid the problems of side-lobe effect.

(2) Description of the Prior Art

Phase shifting masks and attenuating phase shifting masks have been used in the manufacture of integrated circuit wafers for some time.

U.S. Pat. No. 5,593,801 to Yoshioka et al. describes an attenuating type phase shifting mask used with an attenuating auxiliary type phase shifting mask and their use in the manufacture in integrated circuit wafers.

U.S. Pat. No. 5,288,569 to Lin describes the use of feature biassing applied to phase shifting masks to improve the exposure latitude and depth of focus of an optical projection imaging system.

U.S. Pat. No. 5,510,214 to Pan et al. describes the use of a double destruction phase shifting mask which combines transparent phase shifting regions and attenuating phase shifting regions to improve the quality of images produced by the masks.

The mask and methods described herein are different from the inventions of Yoshioka et al., Lin, or Pan et al. In the present invention a mask having a first pattern formed in attenuating phase shifting material is used with a second pattern formed in opaque material to form a rim type mask. The pattern edge is defined by the first pattern in the attenuating phase shifting material thereby achieving the advantages of an attenuating phase shifting mask. The rim formed from the pattern in the opaque material prevents problems resulting from the side-lobe effect due to the light transmitted through the attenuating phase shifting material.

SUMMARY OF THE INVENTION

Mask patterns formed using attenuating phase shifting material are frequently used in the manufacture of integrated circuit wafers. These masks work well but problems are still encountered as linear dimensions decrease into the 0.30 to 0.35 micrometer range. A conventional mask 18 using attenuating phase shifting material is shown in FIGS. 1 and 2. FIG. 1 shows a top view of the mask having pattern openings 12 formed in attenuating phase shifting material 14. FIG. 2 shows a cross section view of the mask taken along line 2—2' of FIG. 1. As shown in FIG. 2, the mask is formed on a transparent mask substrate.

FIG. 3 shows a block diagram of an apparatus, such as a 5× reduction stepper or the like, used to focus an image of the mask pattern on an integrated circuit wafer. A light source 20 provides a beam of light 21 having a particular wavelength, such as 365 nanometers for an i line source. A mask holder 22 holds a mask 28 in place and the beam of light 21 from the light source is directed on the mask 28. The light 23 emerging from the mask then passes through a lens array 24 and the light 25 emerging from the lens 24 is focussed on a layer of resist 27 formed on the integrated circuit wafer 26.

FIG. 4A shows a beam of light 30 impinging on the conventional mask 18 using attenuating phase shifting material. FIG. 4B shows the electric field of the light beam as it exits the mask. As shown in FIG. 4B, the electric field 17 of the light which passes through the attenuating phase shifting material to be both attenuated and shifted in phase by 180° when compared to the electric field 16 of the light which does not pass through the attenuating phase shifting material. FIG. 4C shows the intensity of the light as it is focussed on the resist layer. As shown in FIG. 4C, the intensity 19 of the light which does not pass through the attenuating phase shifting material is greater than the intensity 17 of the light which does pass through the attenuating phase shifting material. However, the intensity of the light which does pass through the attenuating phase shifting material is not zero and this causes the problem of side-lobes which can expose or partially expose the resist at unwanted locations. This non zero intensity, or side-lobe effect, causes problems when masks of this type are used to form features having particularly small dimensions, such as in the 0.30 to 0.35 micrometer range.

It is a principle objective of this invention to provide a mask using attenuating phase shifting material which avoids the problem of side-lobes caused by the transmittance of the attenuating phase shifting film.

It is another principle objective of this invention to provide a method of forming resist patterns on an integrated circuit wafer using a mask with attenuating phase shifting material which avoids the problem of side-lobes caused by the transmittance of the attenuating phase shifting film.

It is another principle objective of this invention to provide a method of forming a mask using attenuating phase shifting material which avoids the problem of side-lobes caused by the transmittance of the attenuating phase shifting film.

These objectives are achieved using a ring type attenuating phase shifting mask. The pattern in the mask is defined using attenuating phase shifting material. A second pattern formed in opaque material is then formed over the attenuating phase shifting material. A gap width of attenuating phase shifting material is not covered by the opaque material pattern and defines the pattern in the attenuating phase shifting material. The mask is formed using lithography methods wherein the resist patterns are formed using an electron beam.

BRIEF DESCRIPTION OF THE DRAWINGS

FIG. 1 shows a top view of a conventional mask formed using attenuating phase shifting material.

FIG. 2 shows a cross section view of the mask of FIG. 1.

DESCRIPTION OF THE PREFERRED EMBODIMENTS

Figure 5:
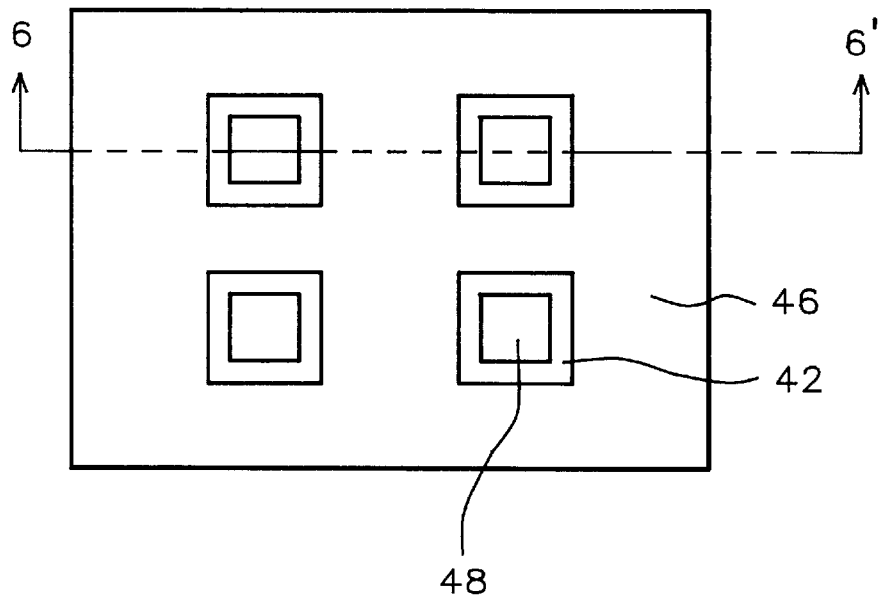
FIG. 5 shows a top view of a the mask of this invention.

Refer now to FIGS. 5–7C, for a description of the preferred embodiment of the mask of this invention. FIG. 5 shows a top view of the mask of this invention showing a first pattern 48 defined by attenuating phase shifting material 42. A layer of opaque material 46 is then formed over the patterned layer of attenuating phase shifting material and patterned such that the edges of the first pattern formed in the layer of attenuating phase shifting material are exposed. The first pattern shown in this embodiment is suitable for forming openings in resist material such as would be used to form via holes or the like. Those skilled in the art will readily recognize that any pattern could be used such as parallel lines for defining electrode patterns.

Figure 6:
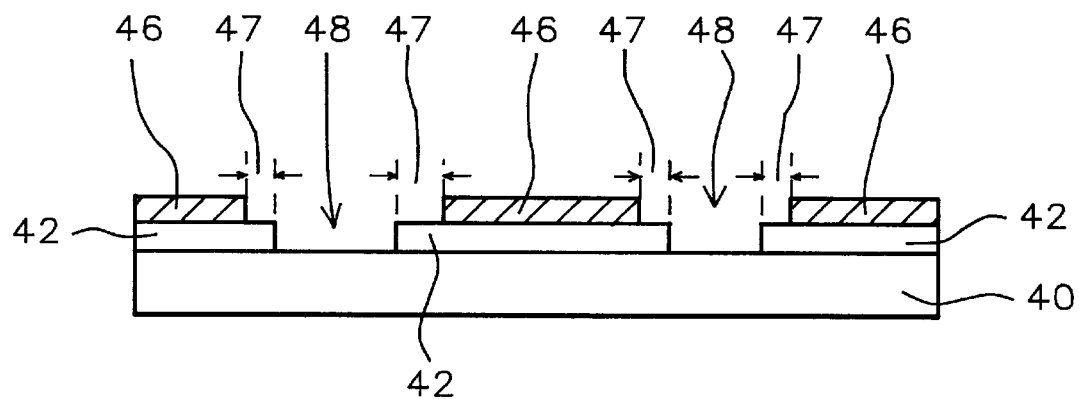
FIG. 6 shows a cross section view of the mask of this invention.

FIG. 6 shows a cross section view of the mask of this invention taken along line 6—6' in FIG. 5. FIG. 6 shows that the attenuating phase shifting material 42 is formed on a transparent mask substrate 40 with the first pattern 48 formed in the attenuating phase shifting material 42. In this example the transparent mask substrate 40 is quartz having a thickness of between about 0.2 and 0.3 inches. A second pattern is formed in a layer of opaque material 46 on the layer of phase shifting material. In this example the attenuating phase shifting material is a layer of MoSiON having a thickness between about 100 and 140 nanometers. The thickness is chosen such that the attenuating phase shifting material will provide a 180° phase shift, compared to light not passing through the attenuating phase shifting material, for light having a wavelength of the light used to illuminate the mask when the image is formed on a resist layer. In this example an i line light source is used so the wavelength of the light is 365 nanometers.

A second pattern is formed in a layer of opaque material 46 formed on the attenuating phase shifting material 42. The second pattern exposes the edges of the pattern formed in the attenuating phase shifting material such that a gap width 47 of attenuating phase shifting material is exposed. In this example the gap width 47 is between about 0.35 and 0.45 micrometers for an i-line stepper. In this example the layer of opaque material is chrome having a thickness of between about 80 and 120 nanometers. The second pattern completes a rim type mask wherein the first pattern formed in the attenuating phase shifting material defines the pattern edges and the second pattern formed in opaque material prevents problems due to side-lobe effects described earlier.

Figure 7A:
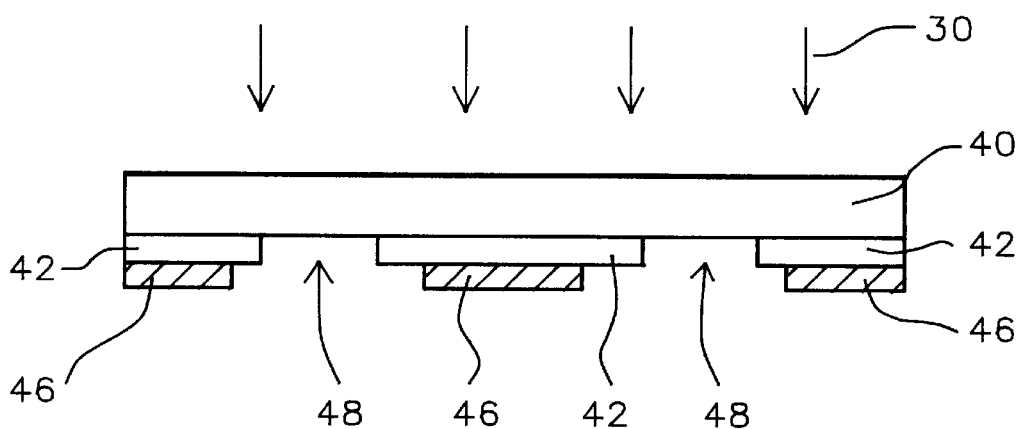
FIG. 7A shows a diagram of light passing through the mask of this invention.
Figure 7B:
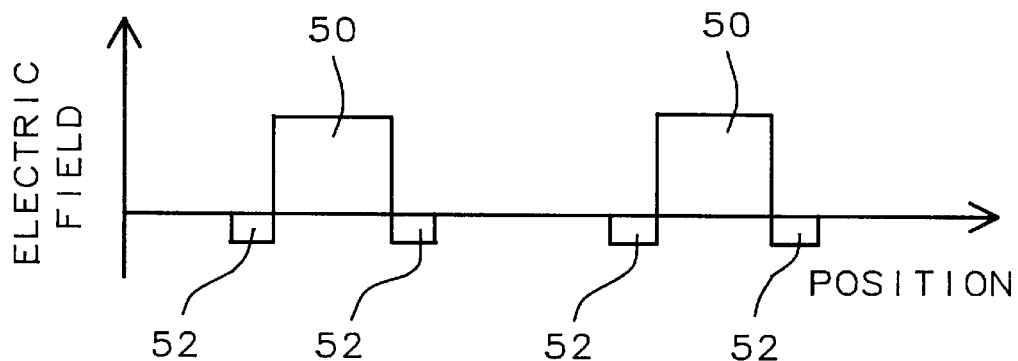
FIG. 7B shows a curve of the electric field of the light exiting the mask of this invention.
Figure 7C:
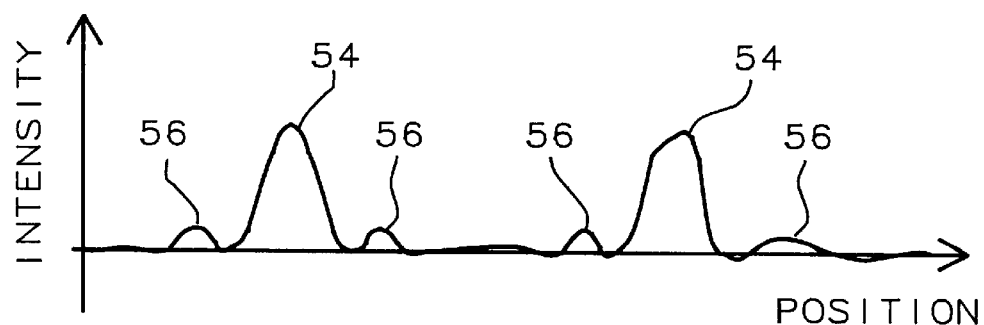
FIG. 7C shows a curve the intensity of the light passing through the mask of this invention and focussed at the integrated circuit wafer.

FIG. 7A shows a beam of light 30 impinging on the mask of this invention. FIG. 7B shows the electric field of the light beam as it exits the mask. As shown in FIG. 7B, the electric field 52 of the light which passes through the attenuating phase shifting material to be both attenuated and shifted in phase by 180° when compared to the electric field 50 of the light which does not pass through the attenuating phase shifting material. As shown in FIG. 7B the opaque material blocks the light transmission through the mask entirely resulting in zero electric field. FIG. 7C shows the intensity of the light as it is focussed on the resist layer. As shown in FIG. 7C, the intensity 54 of the light which does not pass through the attenuating phase shifting material is greatest. There are small intensity peaks 56 due to the light passing through the attenuating phase shifting material but the intensity of the light at positions relating to the opaque material of the mask is near zero. These regions of near zero light intensity prevents the problem of side-lobes while retaining the advantages of an attenuating phase shifting mask.

Figure 3:
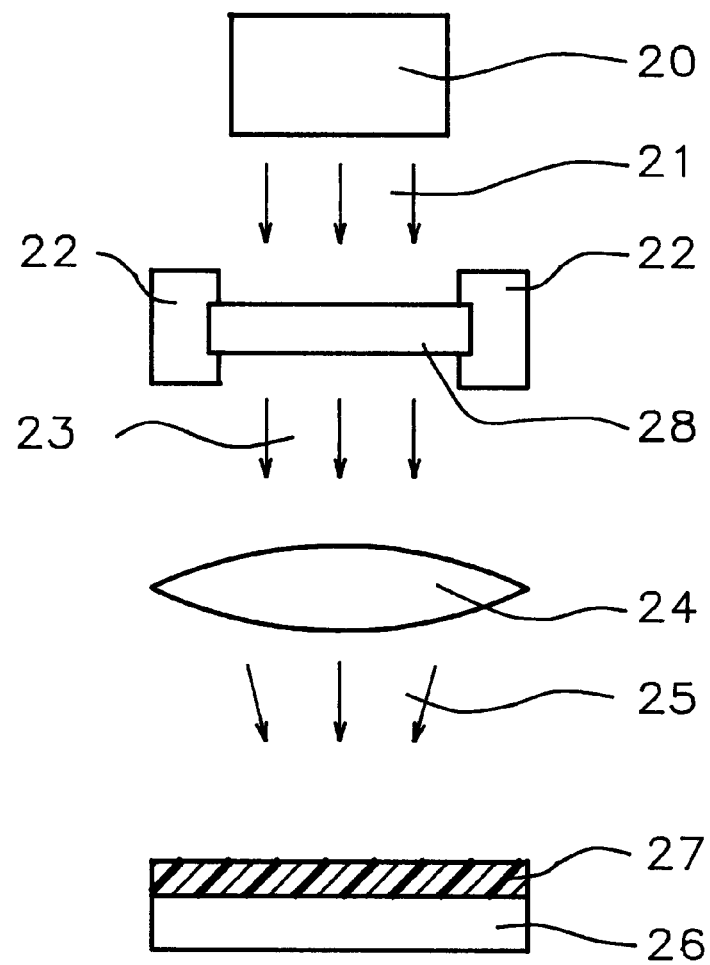
FIG. 3 shows a block diagram of an apparatus used to transfer a mask pattern to a layer of resist on an integrated circuit wafer.
Figure 4A:
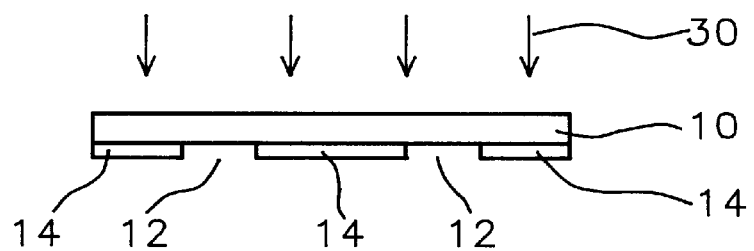
FIG. 4A shows a diagram of light passing through the mask of FIG. 1.
Figure 4B:
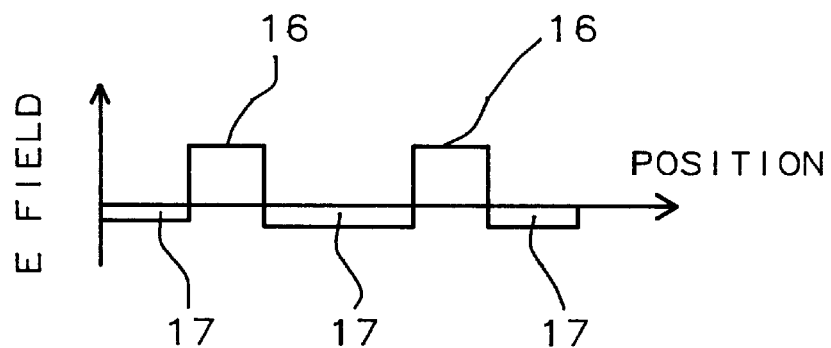
FIG. 4B shows a curve of the electric field of the light exiting the mask of FIG. 1.
Figure 4C:
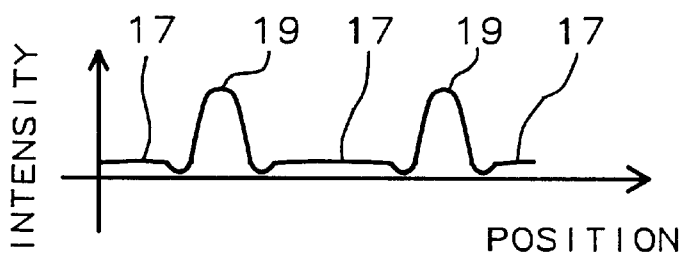
FIG. 4C shows a curve the intensity of the light passing through the mask of FIG. 1 and focussed at the integrated circuit wafer.

Refer now to FIG. 3 for a description of the preferred embodiment of a method of forming images in a layer of resist material using the mask of this invention. FIG. 3 shows a block diagram of an apparatus, such as a 5× stepper, used to expose a layer of resist 27 on a substrate 26. In this example the substrate 26 is an integrated circuit wafer and the resist 27 is photoresist. A light source 20 provides a light beam 21 at a characteristic wavelength. In this example the light source 20 is an i line source providing a light beam 21 having a wavelength of 365 nanometers.

The light beam illuminates a mask 28 held by a mask holder 22. In this example the mask 28 is the mask of this invention shown in FIGS. 6 and 7. The light passing through the mask 23 passes through a focussing lens 24. The light 25 emerging from the focussing lens 24 is focussed on a layer of resist 27 which is formed on a substrate 26. In this example the substrate 26 is an integrated circuit wafer and the resist 27 is a layer of photoresist having a thickness of between about 0.8 and 1.25 micrometers. The light 25 emerging from the focussing lens 24 exposes the layer of resist 27 which is then developed to provide a mask to transfer the pattern from the mask 28 to the substrate 26.

Figure 8A:
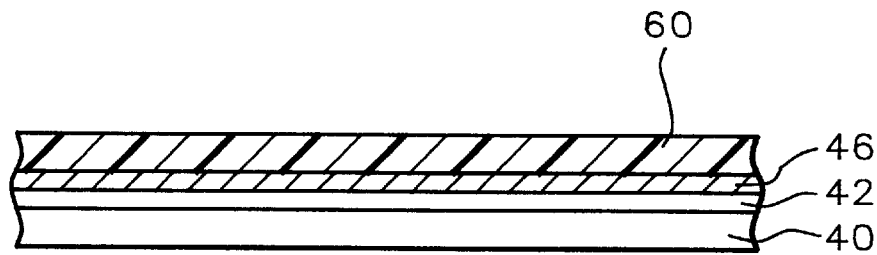
FIG. 8A shows a layer of attenuating phase shifting material, a layer of opaque material, and a layer of first resist material deposited on a transparent mask substrate.

Refer now to FIGS. 8A–10 for a description of the preferred embodiment of a method of forming the mask of this invention. As shown in FIG. 8A a layer of attenuating phase shifting material 42 is deposited on a transparent mask substrate 40 and a layer of opaque material 46 is formed on the layer of attenuating phase shifting material 42. In this example the transparent mask substrate 40 is quartz having a thickness of between about 0.2 and 0.3 inches, the attenuating phase shifting material MoSiON having a thickness of between about 100 and 140 nanometers, and the layer of opaque material is chrome having a thickness of between about 80 and 120 nanometers. The MoSiON and the chrome are deposited by means of sputtering. A layer of first resist material 60 is then formed on the layer of opaque material 46.

Figure 8B:
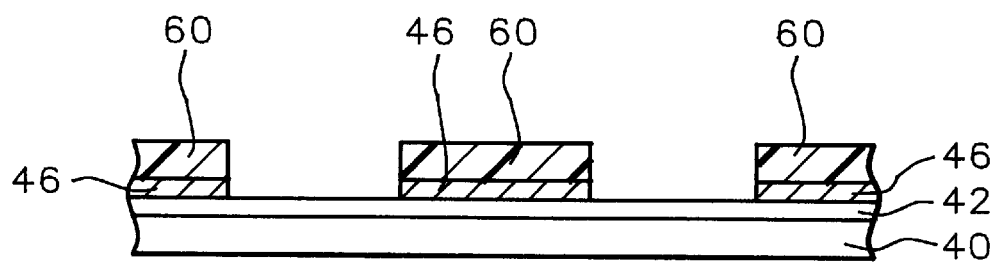
FIG. 8B shows the patterned first resist material and the patterned opaque material on the layer of attenuating phase shifting material and the transparent mask substrate.
Figure 9A:
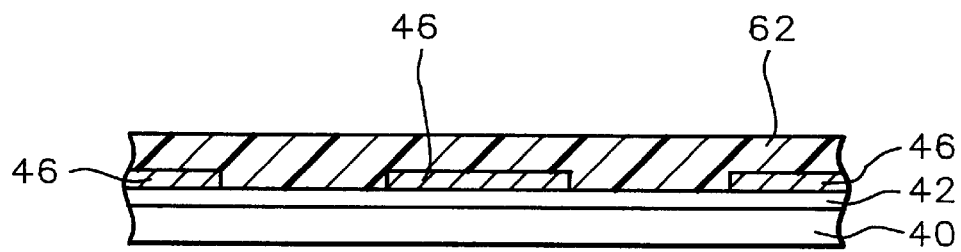
FIG. 9A shows a layer of second resist material formed over the patterned opaque material.

As shown in FIG. 8B the first resist material 60 is then patterned by means of exposing the first resist 60 with an electron beam and developing the exposed first resist 60. The opaque material not protected by the developed first resist material is then etched away using wet etching techniques. The first resist material is then stripped. As shown in FIG. 9A, a layer of second resist material 62 is then formed over the patterned opaque material.

Figure 9B:
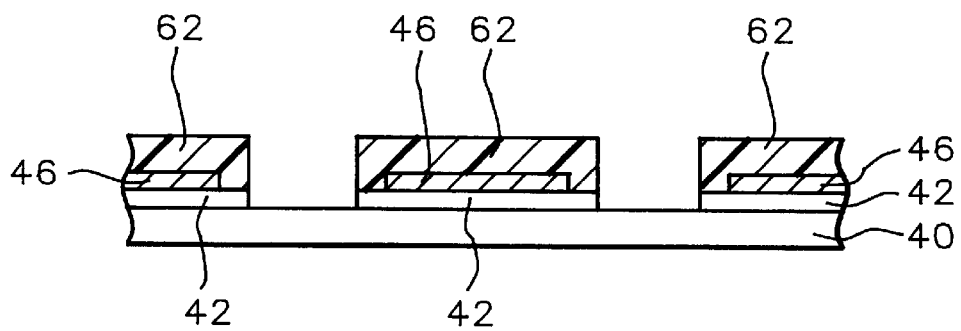
FIG. 9B shows a patterned layer of second resist material on the patterned opaque material and the patterned attenuating phase shifting material.

As shown in FIG. 9B, the second resist material is then patterned by means of exposing the second resist 62 with an electron beam and developing the exposed second resist 62.

Figure 10:
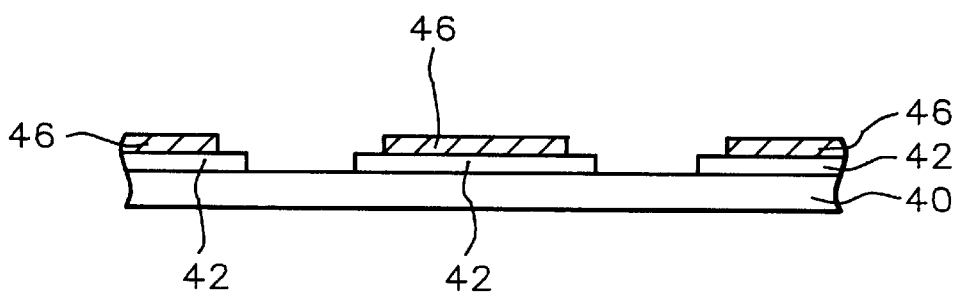
FIG. 10 shows a cross section view of the completed mask.

The attenuating phase shifting material 42 not protected by the developed second resist material 62 is then etched away using wet etching techniques. As shown in FIG. 10 the second resist material is then stripped and the mask is completed. As shown in FIG. 10 the opaque material is patterned such that the pattern edges of the pattern formed in the attenuating phase shifting material and a gap width 47 of attenuating material at the pattern edges of the pattern formed in the attenuating phase shifting material are exposed. In this example the gap width is between about 0.35 and 0.45 micrometers for an i-line stepper.

While the invention has been particularly shown and described with reference to the preferred embodiments thereof, it will be understood by those skilled in the art that various changes in form and details may be made without departing from the spirit and scope of the invention.

What is claimed is:

1. A method of forming photolithographic patterns, comprising the steps of:

providing an integrated circuit wafer;

providing a mask formed on a transparent mask substrate; wherein said mask comprises a first pattern having first pattern edges and formed in a layer of attenuating phase shifting material on said transparent mask substrate so that said first pattern exposes a part of said transparent mask substrate, wherein said attenuating phase shifting material is MoSiON, and a second pattern, formed in a layer of opaque material on said layer of attenuating phase shifting material, wherein said second pattern exposes that part of said attenuating phase shifting material within a gap width of said first patterned edges and that part of said transparent mask substrate exposed by said first pattern;

forming a layer of photoresist on said integrated circuit wafer;

passing light having a characteristic wavelength through said mask;

focussing said light passing through said mask on said layer of photoresist; and developing said layer of photoresist.

2. The method of claim 1 wherein said layer of MoSiON has a thickness of between about 100 and 140 nanometers.

3. The method of claim 1 wherein said layer of opaque material is chrome having a thickness of between about 80 and 120 nanometers.

4. The method of claim 1 wherein said gap width is between about 0.35 and 0.45 micrometers.

5. The method of claim 1 wherein said layer of attenuating phase shifting material provides a phase shift of about 180° for light having said characteristic wavelength.

6. The method of claim 1 wherein said characteristic wavelength is 365 nanometers.

7. The method of claim 1 wherein said transparent mask substrate is quartz having a thickness of between about 0.2 and 0.3 inches.

8. A mask, comprising:

a transparent mask substrate;

a patterned layer of attenuating phase shifting material, wherein said attenuating phase shifting material is MoSiON, having a first pattern formed on said transparent mask substrate, wherein said first pattern has first pattern edges and exposes a part of said transparent mask substrate; and a patterned layer of opaque material having a second pattern formed on said layer of attenuating phase shifting material, wherein said second pattern exposes that part of said attenuating phase shifting material within a gap width of said first pattern edges and said second pattern exposes that part of said transparent mask substrate exposed by said first pattern.

9. The mask of claim 8 wherein said patterned layer of MoSiON has a thickness of between about 100 and 140 nanometers.

10. The mask of claim 8 wherein said patterned layer of opaque material is chrome having a thickness of between about 80 and 120 nanometers.

11. The mask of claim 8 wherein said gap width is between about 0.35 and 0.45 micrometers.

12. The mask of claim 8 wherein said layer of attenuating phase shifting material provides a phase shift of about 180° for light having a wavelength of 365 nanometers.

13. The mask of claim 8 wherein said transparent mask substrate has a thickness of between about 0.2 and 0.3 inches.

14. A method of forming a mask, comprising the steps of:

providing a transparent mask substrate;

depositing a layer of attenuating phase shifting material on said transparent mask substrate;

patterning said layer of attenuating phase shifting material using photolithographic techniques thereby forming a first pattern having first pattern edges in said layer of attenuating phase shifting material and exposing a part of said transparent mask substrate;

depositing a layer of opaque material on said transparent mask substrate covering said patterned layer of attenuating phase shifting material;

patterning said layer of opaque material using photolithographic techniques thereby forming a second pattern in said layer of opaque material, wherein said second pattern exposes that part of said attenuating phase shifting material within a gap width of said first pattern edges, and said second pattern exposes that part of said transparent mask substrate exposed by said first pattern.

15. The method of claim 14 wherein said layer of attenuating phase shifting material is MoSiON having a thickness of between about 100 and 140 nanometers.

16. The method of claim 14 wherein said layer of opaque material is chrome having a thickness of between about 80and 120 nanometers.

17. The method of claim 14 wherein said gap width is between about 0.35 and 0.45 micrometers.

18. The method of claim 14 wherein said layer of attenuating phase shifting material provides a phase shift of about 180° for light having a wavelength of 365 nanometers.

19. The method of claim 14 wherein said transparent mask substrate has a thickness of between about 0.2 and 0.3 inches.

20. The method of claim 14 where said patterning said layer of attenuating phase shifting material using photolithographic techniques and said patterning said layer of opaque material using photolithographic techniques comprises exposing a layer of resist with an electron beam.

* * * * *